United States Patent
Tomita

(10) Patent No.: US 10,199,978 B2
(45) Date of Patent: Feb. 5, 2019

(54) MULTIPHASE DRIVER DEVICE AND THREE-PHASE DRIVER DEVICE

(71) Applicant: Fuji Electric Co., Ltd., Kanagawa (JP)

(72) Inventor: Wataru Tomita, Nagano (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 15/803,715

(22) Filed: Nov. 3, 2017

(65) Prior Publication Data

US 2018/0175773 A1    Jun. 21, 2018

(30) Foreign Application Priority Data

Dec. 16, 2016 (JP) ................................ 2016-244137
Feb. 16, 2017 (JP) ................................ 2017-027165

(51) Int. Cl.
*H02P 27/06*      (2006.01)

(52) U.S. Cl.
CPC .................................... *H02P 27/06* (2013.01)

(58) Field of Classification Search
CPC .......... H02P 27/06; H02P 6/085; H02P 9/305
USPC ............... 327/108, 112, 376–378, 427, 434; 328/400.26, 400.06, 400.22, 722
See application file for complete search history.

(56) References Cited

U.S. PATENT DOCUMENTS

| | | | | | |
|---|---|---|---|---|---|
| 4,876,491 | A | * | 10/1989 | Squires | ..................... H02P 6/06 318/400.33 |
| 5,235,264 | A | * | 8/1993 | Kaneda | ................... H02P 6/187 318/400.38 |
| 8,427,225 | B2 | * | 4/2013 | Nakatake | ................ H02M 1/08 327/108 |
| 8,717,069 | B2 | * | 5/2014 | Curbelo | ............... H03K 17/163 327/108 |
| 8,947,838 | B2 | * | 2/2015 | Yamai | ..................... G01R 31/02 361/23 |
| 9,143,052 | B2 | | 9/2015 | Amano | |
| 9,704,591 | B2 | * | 7/2017 | Taigor | .................... G11C 16/28 |
| 9,917,538 | B2 | * | 3/2018 | Kanekawa | ................ H02P 6/12 |
| 2004/0004455 | A1 | * | 1/2004 | Fujimoto | .................. H02P 6/20 318/474 |
| 2009/0302825 | A1 | * | 12/2009 | Hsieh | ........................ G05F 3/24 323/315 |

(Continued)

FOREIGN PATENT DOCUMENTS

JP    2008-312372 A    12/2008
JP    2013-240252 A    11/2013

*Primary Examiner* — Thai Dinh
(74) *Attorney, Agent, or Firm* — Chen Yoshimura LLP

(57) ABSTRACT

A multiphase driver device includes: one phase driver circuit of a first type including a first monitoring transistor and a first monitoring resistor generating a first voltage that is proportional to a first source current supplied to a one of the plurality of semiconductor switches; and a plurality of phase driver circuits of a second type each including a second monitoring transistor and a second monitoring resistor generating a second voltage that is proportional to that a second source current supplied to corresponding one of the remaining semiconductor switches, each of the plurality of phase driver circuits of the second type further including a comparator that compares the second voltage to the reference voltage, and a first regulating transistor that adds a first regulating current to the second source current in accordance with an output of the comparator.

10 Claims, 7 Drawing Sheets

(56) References Cited

U.S. PATENT DOCUMENTS

2015/0188466 A1* 7/2015 Chiu .................. H02P 6/182
                                                    318/400.35

* cited by examiner

MULTIPHASE DRIVER DEVICE AND THREE-PHASE DRIVER DEVICE

BACKGROUND OF THE INVENTION

Technical Field

The present invention relates to a multiphase driver device and a three-phase driver device, and more particularly to a multiphase driver device and a three-phase driver device that are integrated onto single chips and include a plurality of or three phase driver circuits capable of respectively driving a plurality of or three semiconductor switches.

Background Art

One type of well-known devices for controlling power is intelligent power devices (also known as intelligent power modules (IPMs)), in which semiconductor switches and a driver device (control integrated circuit (IC)) therefor are integrated. IPMs are used in devices in a wide range of fields in which small size, high efficiency, low noise, long lifespan, and high reliability are required, such as in motor driving devices and power supply devices. Among such IPMs, there are IPMs that include semiconductor switches for three phases and a driver device therefor. Here, insulated gate bipolar transistors (IGBTs) are primarily used for the semiconductor switches.

FIG. 7 illustrates a common IPM that includes semiconductor switches for three phases and a driver device therefor. This IPM includes a three-phase single-chip gate driver IC 100 as the driver device and includes an X-phase IGBT 110x, a Y-phase IGBT 110y, and a Z-phase IGBT 110z as the semiconductor switches.

The three-phase single-chip gate driver IC 100 includes therein an X-phase driver circuit, a Y-phase driver circuit, and a Z-phase driver circuit for respectively generating gate signals VOUTx, VOUTy, and VOUTz. The gate signal VOUTx is output to the gate of the X-phase IGBT 110x, the gate signal VOUTy is output to the gate of the Y-phase IGBT 110y, and the gate signal VOUTz is output to the gate of the Z-phase IGBT 110z. The three-phase single-chip gate driver IC 100 further includes a protection feature that stops operation of the IGBTs 110x, 110y, and 110z upon detection of abnormality causes such as overcurrent, short-circuits, decreases in supply voltage, and overheating in the IGBTs 110x, 110y, and 110z.

Here, the X-phase driver circuit, the Y-phase driver circuit, and the Z-phase driver circuit included in the three-phase single-chip gate driver IC 100 each have equivalent circuit configuration and parameters. Therefore, the X-phase driver circuit, the Y-phase driver circuit, and the Z-phase driver circuit have a substantially equal capacity to supply the gate signals VOUTx, VOUTy, and VOUTz that are output to the gates of the IGBTs 110x, 110y, and 110z.

However, although the X-phase driver circuit, the Y-phase driver circuit, and the Z-phase driver circuit are respectively manufactured with the same pattern, these circuits do not necessarily operate under exactly the same conditions due to the on-chip layout and variations in circuit element performance. This type of imbalance between phases does not cause any especially serious problems when the amounts of source currents or sink currents applied to the gates of the IGBTs 110x, 110y, and 110z are small.

However, in IPMs in recent years, the gate capacitance of IGBTs has increased, and the drive capabilities of X-phase driver circuits, Y-phase driver circuits, and Z-phase driver circuits are also increasing. As a result, the amounts of the source currents and sink currents have increased dramatically. When large currents on the order of amperes are flowing, the differences in current amount flowing through each phase also increase, which exacerbates the imbalance between the phases.

One known method of reducing this imbalance is the technology disclosed in Patent Document 1. Patent Document 1 describes a technology that balances respective output currents of three units when operating in parallel, which is achieved by delaying the rise of ON-pulses for IGBTs in accordance with the amount of deviation between the output current of each unit and the average value of the output currents of all of the units. To achieve this, in the technology described in Patent Document 1, each unit includes a current detector, an output current deviation detection circuit, a current deviation absolute value circuit, and an ON signal delay circuit.

RELATED ART DOCUMENT

Patent Document

Patent Document 1: Japanese Patent Application Laid-Open Publication No. 2013-240252

SUMMARY OF THE INVENTION

However, in the technology described in Patent Document 1, each unit has to include a large number of circuits in order to reduce imbalances between the units, which results in a problematic increase in circuit scale.

The present invention was made in light of the foregoing and aims to provide a multiphase driver device and a three-phase driver device that make it possible to reduce imbalances between the output currents of the phases without increasing circuit scale. Accordingly, the present invention is directed to a scheme that substantially obviates one or more of the problems due to limitations and disadvantages of the related art.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, the present disclosure provides a multiphase driver device for a plurality of semiconductor switches, including: one phase driver circuit of a first type configured to be connected to one of the plurality of semiconductor switches, the one phase driver circuit of the first type supplying a first source current to one of the plurality of semiconductor switches and including a first monitoring transistor, and a first monitoring resistor that converts a current flowing through the first monitoring transistor to a first voltage such that a value of the first voltage is proportional to the first source current, one phase driver circuit outputting the first voltage as a reference voltage; and a plurality of phase driver circuits of a second type configured to be connected to remaining semiconductor switches of the plurality of semiconductor switches, respectively, each of the plurality of phase driver circuits of the second type supplying a second source current to corresponding one of the remaining switches and including a second monitoring transistor and a second monitoring resistor that converts a current flowing through the second monitoring transistor to a second voltage such that a value of the second voltage is proportional to the second source current, each of the plurality of phase driver circuits of the second type further including a comparator that compares the second voltage to the reference voltage and a first regulating transistor that adds a first regulating current to the second source current in accordance with an output of the comparator.

In another aspect, the present disclosure provides a three-phase driver device for driving a first semiconductor switch, a second semiconductor switch, and a third semiconductor switch, including: a first phase driver circuit that drives the first semiconductor switch; a second phase driver circuit that drives the second semiconductor switch; and a third phase driver circuit that drives the third semiconductor switch, wherein the first phase driver circuit supplies a first source current to a gate of the first semiconductor switch, and includes a first monitoring transistor and a first monitoring resistor that converts a current flowing through the first monitoring transistor to a first voltage such that a value of the first voltage is proportional to the first source current, the first phase driver circuit outputting the first voltage as a reference voltage, wherein the second phase driver circuit supplies a second source current to a gate of the second semiconductor switch, and includes a second monitoring transistor, and a second monitoring resistor that converts a current flowing through the second monitoring transistor to a second voltage such that a value of the second voltage is proportional to the second source current, the second phase driver circuit further including, a first comparator that compares the second voltage to the reference voltage and a first regulating transistor that adds a first regulating current to the second source current in accordance with an output of the first comparator, and wherein the third phase driver circuit supplies a third source current to a gate of the third semiconductor switch, and includes a third monitoring transistor and a third monitoring resistor that converts a current flowing through the third monitoring transistor to a third voltage such that a value of the third voltage is proportional to the third source current, the third phase driver circuit further including a second comparator that compares the third voltage to the reference voltage and a second regulating transistor that adds a second regulating current to the third source current in accordance with an output of the second comparator.

In the multiphase driver device and the three-phase driver device configured as described above, the source currents of the other phase driver circuits are respectively matched to the first source current of the first phase driver circuit, thereby making it possible to reduce any imbalances between the source currents of the phases using a simple configuration. Moreover, when the desired source currents are not obtained, simply by adjusting the first source current that serves as the reference, the other source currents also get adjusted accordingly.

It is to be understood that both the foregoing general description and the following detailed description are exemplary and explanatory, and are intended to provide further explanation of the invention as claimed.

DETAILED DESCRIPTION OF EMBODIMENTS

Embodiments of the present invention will be described in detail with reference to figures.

Figure 1:
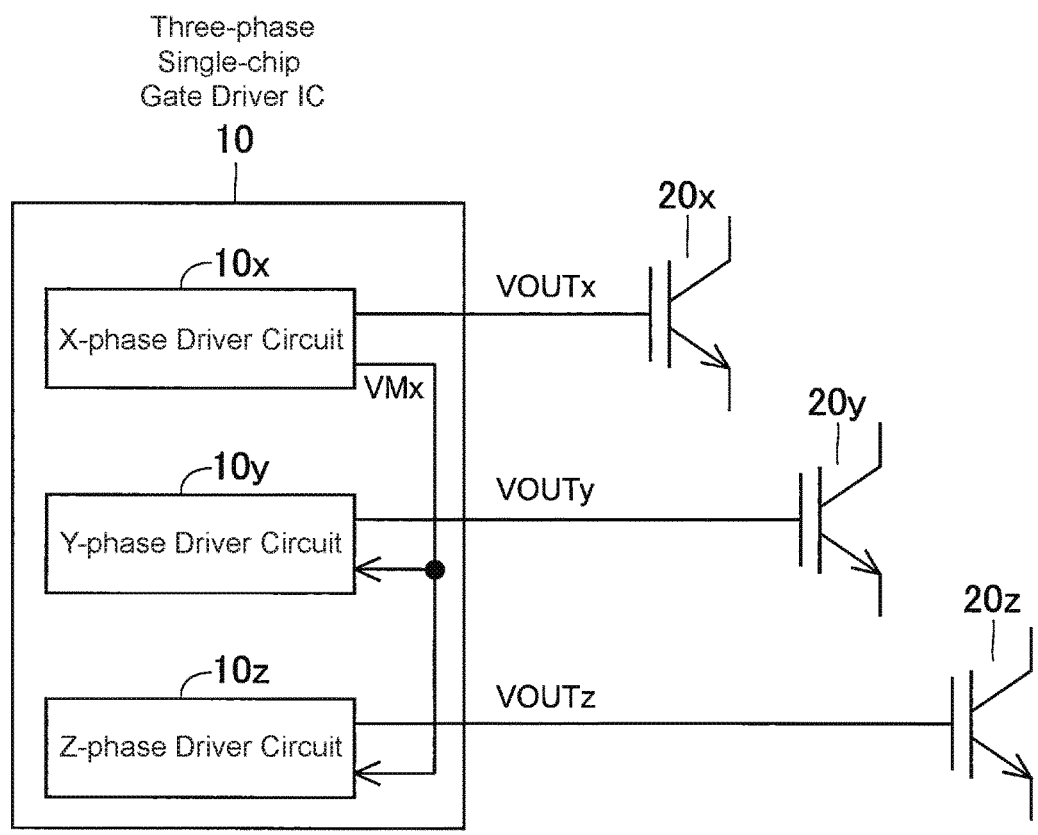
FIG. 1 illustrates an example of a configuration of an IPM according to Embodiment 1.

FIG. 1 illustrates an example of a configuration of an IPM according to Embodiment 1.

The IPM of the present embodiment includes a three-phase single-chip gate driver IC 10 as a three-phase driver device and includes an X-phase IGBT 20x, a Y-phase IGBT 20y, and a Z-phase IGBT 20z as semiconductor switches.

The three-phase single-chip gate driver IC 10 includes therein an X-phase driver circuit 10x that drives the X-phase IGBT 20x, a Y-phase driver circuit 10y that drives the Y-phase IGBT 20y, and a Z-phase driver circuit 10z that drives the Z-phase IGBT 20z. The X-phase driver circuit 10x is a phase driver circuit of a first type, and the Y-phase driver circuit 10y and the Z-phase driver circuit 10z are both phase driver circuits of a second type.

The X-phase driver circuit 10x outputs a gate signal VOUTx to the X-phase IGBT 20x and also outputs, as a reference voltage VMx, a voltage corresponding to the source current (output current) flowing to the gate of the IGBT 20x at that time.

The Y-phase driver circuit 10y outputs a gate signal VOUTy to the Y-phase IGBT 20y. At this time, the Y-phase driver circuit 10y takes the reference voltage VMx as an input and, in accordance with a comparison of this voltage to a voltage corresponding to the source current flowing to the gate of the IGBT 20y, adjusts the source current flowing to the gate. As a result, the source current flowing to the gate of the Y-phase IGBT 20y becomes substantially equal to the source current flowing to the gate of the X-phase IGBT 20x.

The Z-phase driver circuit 10z outputs a gate signal VOUTz to the Z-phase IGBT 20z. At this time, the Z-phase driver circuit 10z takes the reference voltage VMx as an input and, in accordance with a comparison of this voltage to a voltage corresponding to the source current flowing to the gate of the IGBT 20z, adjusts the source current flowing to the gate. As a result, the source current flowing to the gate of the Z-phase IGBT 20z becomes substantially equal to the source current flowing to the gate of the X-phase IGBT 20x.

Here, the collectors of the IGBTs 20x, 20y, and 20z are respectively connected to one ends of the stator winding of a three-phase induction motor, for example, and the emitters are connected together. Therefore, when the three-phase induction motor is to start, the IGBTs $20x$, $20y$, and $20z$ are switched ON due to the gate signals VOUTx, VOUTy, and VOUTz being applied thereto, which makes it possible to star-connect the stator winding.

At this time, the source currents respectively supplied to the gates of the IGBTs $20x$, $20y$, and $20z$ are substantially equal, and therefore there is no imbalance between the output currents of the phases. Here, a three-phase AC voltage is applied to the other ends of the stator winding of the three-phase induction motor, which starts rotating as a result.

Once the three-phase induction motor has accelerated to a prescribed rotational speed, the IGBTs $20x$, $20y$, and $20z$ are simultaneously switched OFF by terminating application of the respective gate signals VOUTx, VOUTy, and VOUTz thereto. Then, the stator winding is switched to delta connection using another semiconductor switch, and the three-phase induction motor continues operating.

Figure 2:
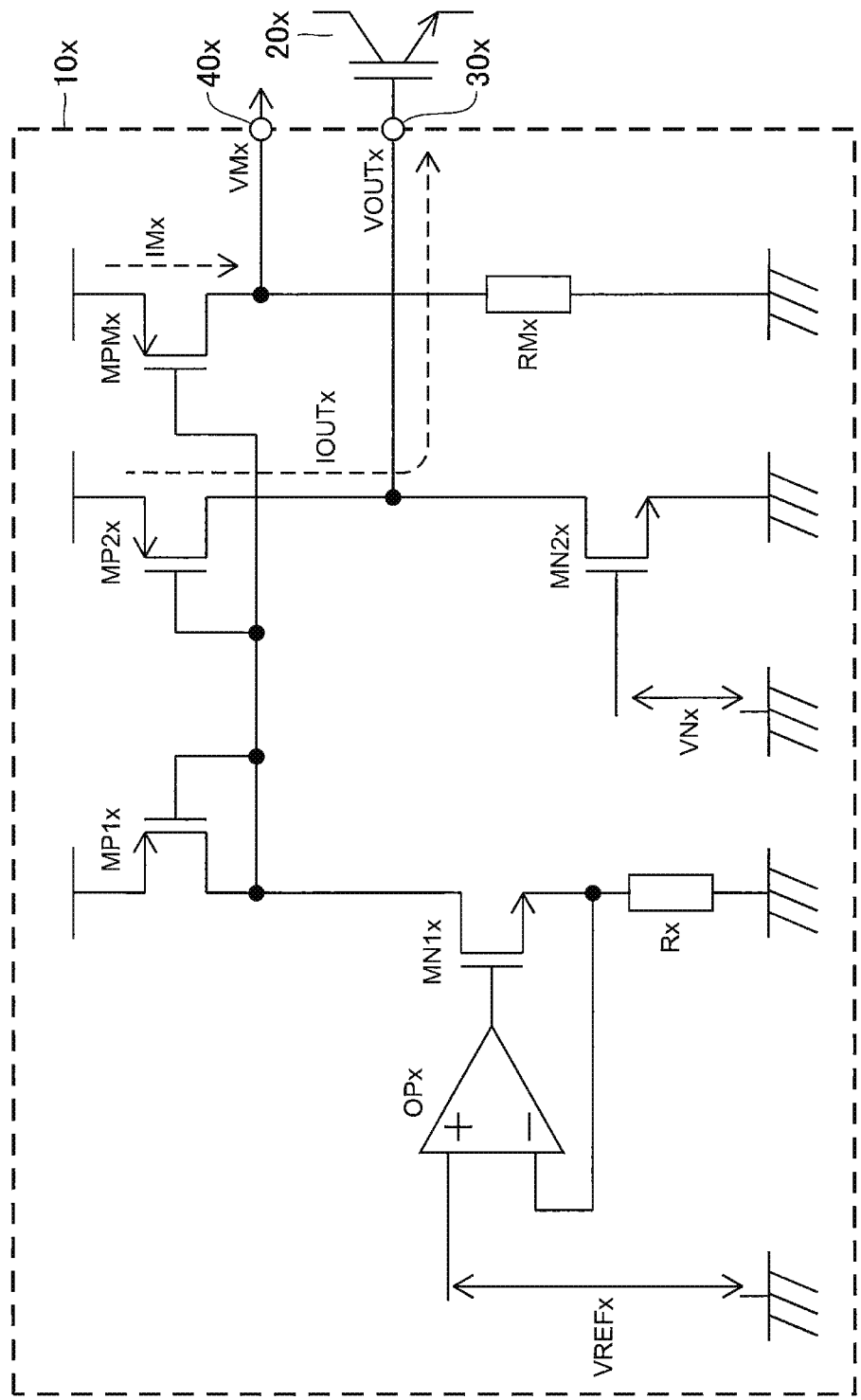
FIG. 2 is a circuit diagram illustrating a specific example of an X-phase driver circuit in a three-phase single-chip gate driver IC used in the IPM according to Embodiment 1.

FIG. 2 is a circuit diagram illustrating a specific example of the X-phase driver circuit in the three-phase single-chip gate driver IC used in the IPM according to Embodiment 1.

The X-phase driver circuit $10x$ includes an op-amp OPx, and the non-inverting input thereof takes as input a signal VREFx for switching ON the IGBT $20x$. The output of the op-amp OPx is connected to the gate of an n-channel MOSFET (metal-oxide-semiconductor field-effect transistor) (hereinafter, "NMOS transistor") MN1x. The source of the NMOS transistor MN1x is connected to one end of a resistor Rx, and the other end of the resistor Rx is connected to ground.

The drain of the NMOS transistor MN1x is connected to the drain and gate of a p-channel MOSFET (hereinafter, "PMOS transistor") MP1x, and the source of the PMOS transistor MP1x is connected to a power supply. The drain and gate of the PMOS transistor MP1x are connected to the gate of a PMOS transistor MP2x, and the source of the PMOS transistor MP2x is connected to the power supply. The PMOS transistor MP2x and the PMOS transistor MP1x jointly form a current mirror circuit.

The drain of the PMOS transistor MP2x is connected to the drain of an NMOS transistor MN2x. The gate of the NMOS transistor MN2x forms an input terminal to which a signal VNx for switching OFF the IGBT $20x$ is input, and the source is connected to ground. The node between the drain of the PMOS transistor MP2x and the drain of the NMOS transistor MN2x is connected to an output terminal $30x$ of the X-phase driver circuit $10x$, and the output terminal $30x$ is connected to the gate of the IGBT $20x$.

The X-phase driver circuit $10x$ further includes a PMOS transistor MPMx that, together with the PMOS transistor MP1x, forms a current mirror circuit. The gate of the PMOS transistor MPMx is connected to the drain and gate of the PMOS transistor MP1x, the source is connected to the power supply, and the drain is connected to one end of a resistor RMx. The other end of the resistor RMx is connected to ground. The node between the drain of the PMOS transistor MPMx and the resistor RMx is connected to an output terminal $40x$ which outputs a voltage corresponding to the output current of the X-phase driver circuit $10x$ as the reference voltage VMx.

The operation of the X-phase driver circuit $10x$ when the signal VREFx for switching ON the IGBT $20x$ is input will be described. First, the op-amp OPx compares the voltage of the signal VREFx to the terminal voltage of the resistor Rx and controls the terminal voltage of the resistor Rx so as to become equal to the voltage of the signal VREFx. Due to the terminal voltage of the resistor Rx being fixed to the voltage of the signal VREFx, a constant current flows through the NMOS transistor MN1x and the resistor Rx. Therefore, the op-amp OPx, the NMOS transistor MN1x, and the resistor Rx form a constant current source.

The constant current created in this manner is then input to the PMOS transistor MP1x of the current mirror circuit, which causes the PMOS transistor MP2x to output a current IOUTx that is proportional to the value of the current from that constant current source. For the current IOUTx, a desired output current value can be obtained by appropriately selecting the size ratio (current mirror ratio) of the PMOS transistor MP1x and the PMOS transistor MP2x. This current IOUTx becomes the source current that drives the IGBT $20x$ and is supplied to the gate of the IGBT $20x$ as the gate signal VOUTx.

A voltage indicative of the current IOUTx is generated by the PMOS transistor MPMx and the resistor RMx. Specifically, a current IMx that is proportional to the current IOUTx and is also proportional to the value of the current from the constant current source that is input to the PMOS transistor MP1x of the current mirror circuit flows through the PMOS transistor MPMx. As a result, the output terminal $40x$ outputs the terminal voltage of the resistor RMx as the reference voltage VMx (=IMx×RMx), a value of which is proportional to the current IOUTx. Thus, the current IOUTx is indirectly monitored by the PMOS transistor MPMx and the resistor RMx in the form of the terminal (reference) voltage.

In the X-phase driver circuit $10x$, when the signal VNx for switching OFF the IGBT $20x$ is input, the NMOS transistor MN2x switches ON. As a result, the gate of the IGBT $20x$ is connected to ground, a sink current is drawn from the gate of the IGBT $20x$, and the charge charged in the gate capacitance of the IGBT $20x$ is discharged.

Figure 3:
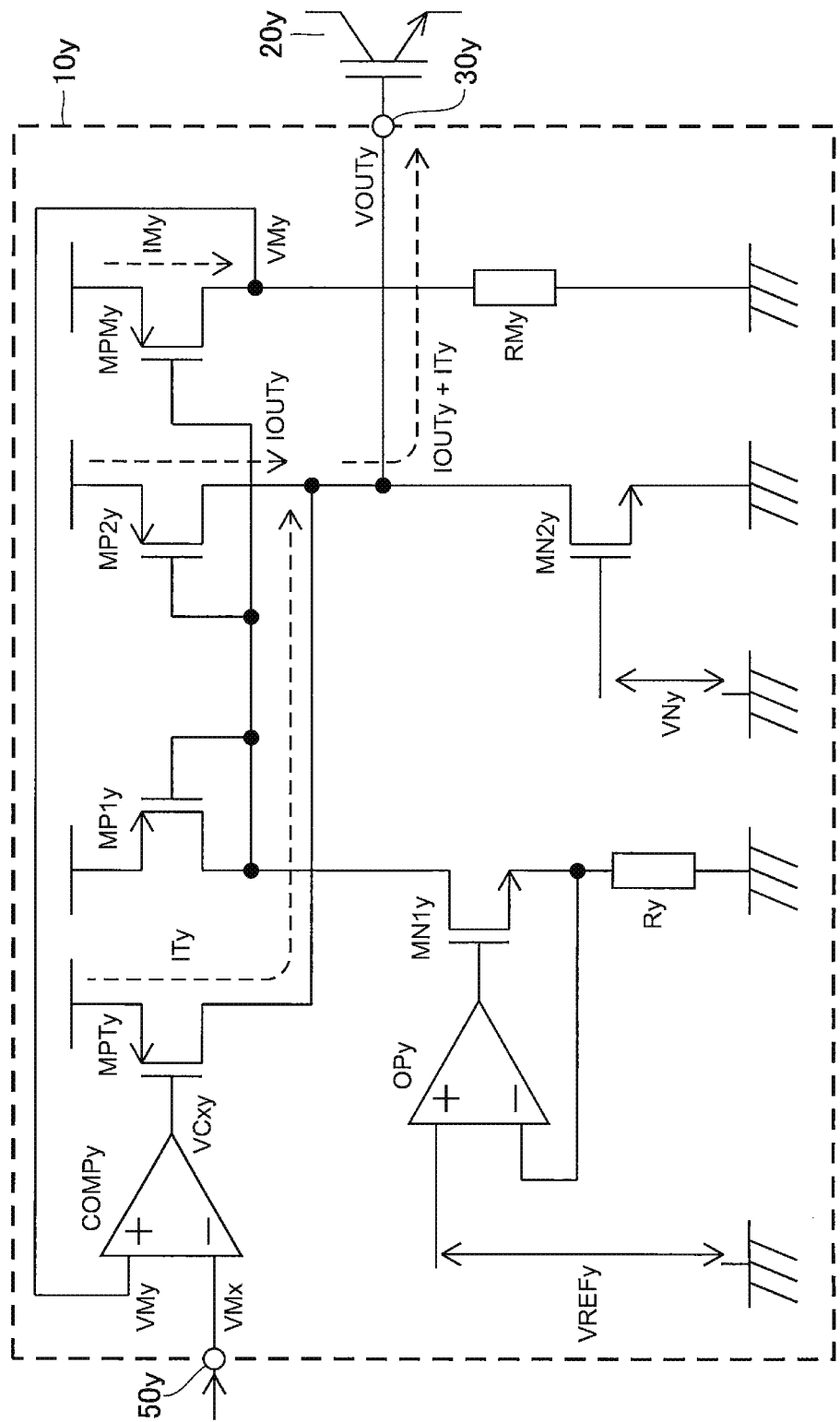
FIG. 3 is a circuit diagram illustrating a specific example of a Y-phase driver circuit in the three-phase single-chip gate driver IC used in the IPM according to Embodiment 1.

FIG. 3 is a circuit diagram illustrating a specific example of the Y-phase driver circuit in the three-phase single-chip gate driver IC used in the IPM according to Embodiment 1.

In the Y-phase driver circuit $10y$, the circuit configuration of a constant current source formed by an op-amp OPy to which a signal VREFy is input, an NMOS transistor MN1y, and a resistor Ry is the same as the circuit configuration of the X-phase driver circuit $10x$. Similarly, the configuration of a current mirror circuit formed by PMOS transistors MP1y and MP2y as well as the circuit configuration of a PMOS transistor MPMy and a resistor RMy that indirectly monitor the source current are the same as in the circuit configuration of the X-phase driver circuit $10x$. Furthermore, a circuit configuration in which an NMOS transistor MN2y receives a signal VNy and draws a sink current is also the same as the circuit configuration of the X-phase driver circuit $10x$. Therefore, a description of the portions of the circuit configuration that are the same as in the circuit configuration of the X-phase driver circuit $10x$ will be omitted here.

The Y-phase driver circuit $10y$ further includes an input terminal $50y$, which receives the reference voltage VMx output by the X-phase driver circuit $10x$. This input terminal $50y$ is connected to the inverting input of a comparator COMPy, and the non-inverting input of this comparator is connected to the node between the monitoring PMOS transistor MPMy and resistor RMy and receives a voltage VMy (=IMy×RMy), which is the terminal voltage of the resistor RMy. The output of the comparator COMPy is connected to the gate of a current regulating PMOS transistor MPTy. The source of the PMOS transistor MPTy is connected to the power supply, and the drain of the PMOS transistor MPTy is connected to the node between the drain of the PMOS transistor MP2y and the drain of the NMOS transistor MN2y.

In the configuration described above, when the signal VREFy for switching ON the IGBT 20y is input, the op-amp OPy, the NMOS transistor MN1y, and the resistor Ry form the constant current source. The current from this constant current source is copied at a prescribed ratio by the current mirror circuit formed by the PMOS transistors MP1y and MP2y and then output as a current IOUTy. The current from the constant current source is also copied at a prescribed ratio by the current mirror circuit formed by the PMOS transistors MP1y and MPMy and then output as a current IMy, which is converted to the voltage VMy by the resistor RMy.

This voltage VMy is input to the comparator COMPy and compared to the reference voltage VMx, which corresponds to the current IOUTx output by the X-phase driver circuit 10x. Here, when the voltage VMy is greater than the reference voltage VMx, the comparator COMPy outputs a signal VCxy at a high (H) level, and therefore the current regulating PMOS transistor MPTy switches OFF. As a result, the source current supplied to an output terminal 30y of the Y-phase driver circuit 10y becomes equal to the current IOUTy.

On the other hand, when the voltage VMy is less than the reference voltage VMx, the comparator COMPy outputs the signal VCxy at a low (L) level, and therefore the current regulating PMOS transistor MPTy switches ON. As a result, the source current supplied to the output terminal 30y of the Y-phase driver circuit 10y becomes equal to the sum of the current IOUTy and a current ITy supplied by the PMOS transistor MPTy. The value of this added adjustment current ITy is determined by appropriately selecting the size of the PMOS transistor MPTy.

In the Y-phase driver circuit 10y, when the signal VNy for switching OFF the IGBT 20y is input, the NMOS transistor MN2y switches ON. As a result, the gate of the IGBT 20y is connected to ground, a sink current is drawn from the gate of the IGBT 20y, and the charge stored in the gate capacitance of the IGBT 20y is discharged.

Figure 4:
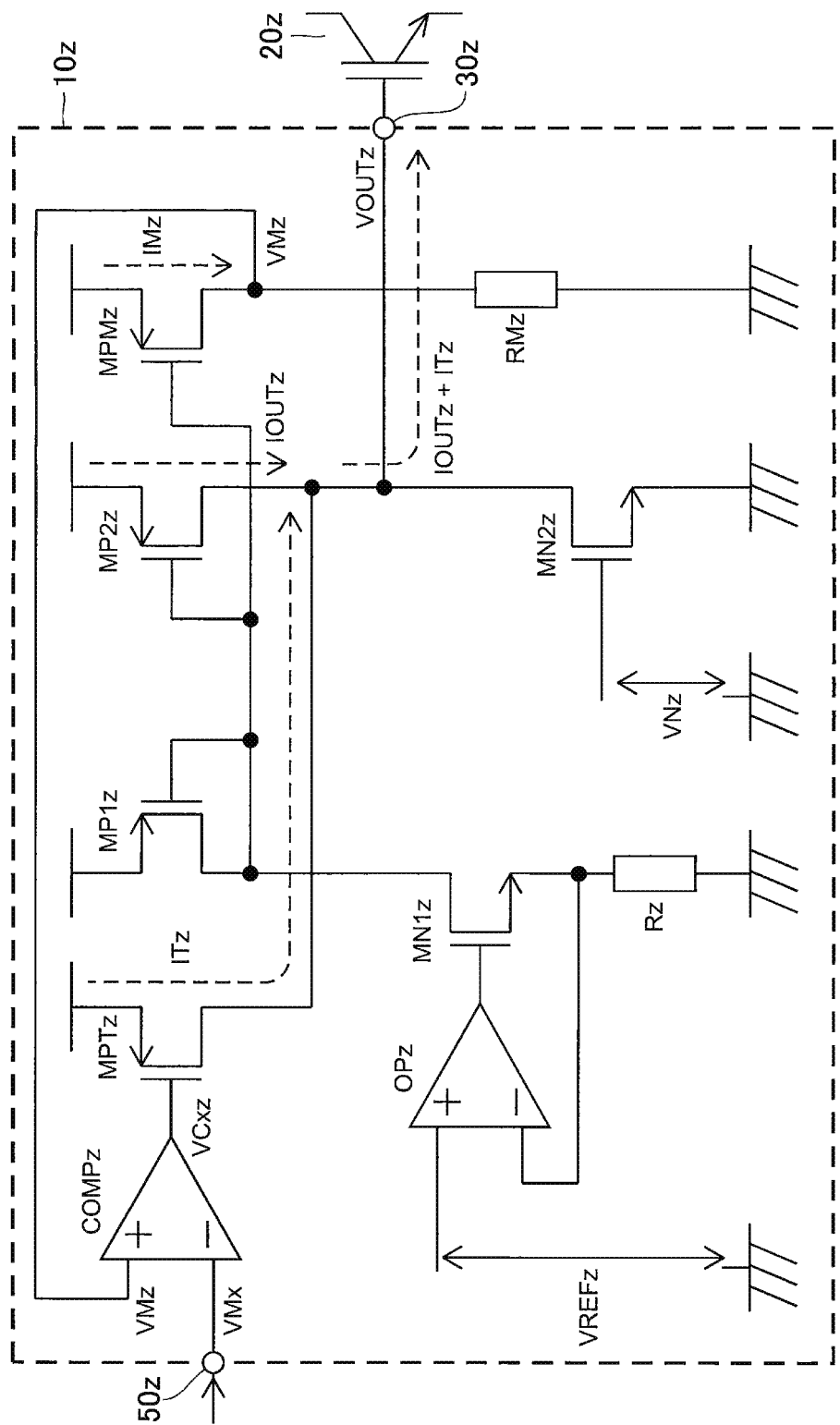
FIG. 4 is a circuit diagram illustrating a specific example of a Z-phase driver circuit in the three-phase single-chip gate driver IC used in the IPM according to Embodiment 1.

FIG. 4 is a circuit diagram illustrating a specific example of the Z-phase driver circuit in the three-phase single-chip gate driver IC used in the IPM according to Embodiment 1.

The circuit configuration of the Z-phase driver circuit 10z is the same as the circuit configuration of the Y-phase driver circuit 10y, and therefore a description of the circuit configuration of the Z-phase driver circuit 10z will be omitted here.

In the Z-phase driver circuit 10z, first, when a signal VREFz for switching ON the IGBT 20z is input, an op-amp OPz, an NMOS transistor MN1z, and a resistor Rz form a constant current source. The current from this constant current source is copied at a prescribed ratio by a current mirror circuit formed by PMOS transistors MP1z and MP2z and then output as a current IOUTz. The current from the constant current source is also copied at a prescribed ratio by a current mirror circuit formed by PMOS transistors MP1z and MPMz and then output as a current IMz, which is converted to a voltage VMz by a resistor RMz.

This voltage VMz is input to a comparator COMPz and compared to the reference voltage VMx input to an input terminal 50z. Here, when the voltage VMz is greater than the reference voltage VMx, the comparator COMPz outputs a signal VCxz at an H level, and therefore the current regulating PMOS transistor MPTz switches OFF. As a result, the source current supplied to an output terminal 30z of the Z-phase driver circuit 10z becomes equal to the current IOUTz.

On the other hand, when the voltage VMz is less than the reference voltage VMx, the comparator COMPz outputs the signal VCxz at an L level, and therefore the current regulating PMOS transistor MPTz switches ON. As a result, the source current supplied to the output terminal 30z of the Z-phase driver circuit 10z becomes equal to the sum of the current IOUTz and a current ITz supplied by the PMOS transistor MPTz.

In the Z-phase driver circuit 10z, when a signal VNz for switching OFF the IGBT 20z is input, an NMOS transistor MN2z switches ON. As a result, the gate of the IGBT 20z is connected to ground, a sink current is drawn from the gate of the IGBT 20z, and the charge stored in the gate capacitance of the IGBT 20z is discharged.

In the IPM of the present embodiment, the Y-phase and Z-phase output currents are controlled so as to match the X-phase output current, thereby making it possible to reduce any imbalances between the output currents of the three phases. Moreover, the X-phase driver circuit 10x, the Y-phase driver circuit 10y, and the Z-phase driver circuit 10z simply have added thereto the monitoring PMOS transistors MPMx, MPMy, and MPMz; the monitoring resistors RMx, RMy, and RMz; the comparators COMPy and COMPz; and the PMOS transistors MPTy and MPTz, and therefore the circuit scale does not become large. Furthermore, when the output currents need to be corrected, only the driver circuit set to be the reference phase needs to be adjusted, which simplifies later correction processes.

Figure 5:
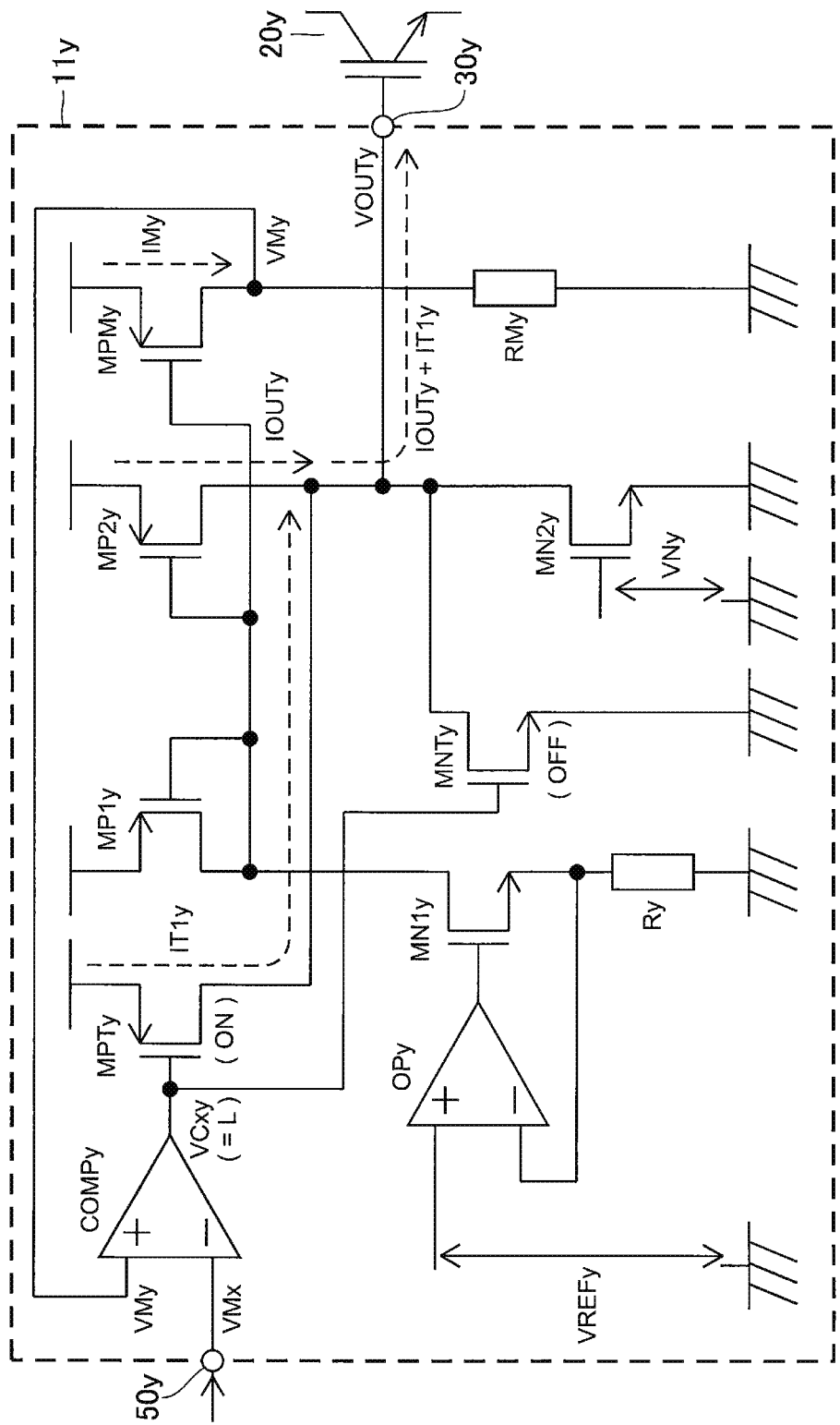
FIG. 5 is a circuit diagram illustrating a specific example of a Y-phase driver circuit in a three-phase single-chip gate driver IC used in an IPM according to Embodiment 2 and is also an explanatory drawing of additive output current control.
Figure 6:
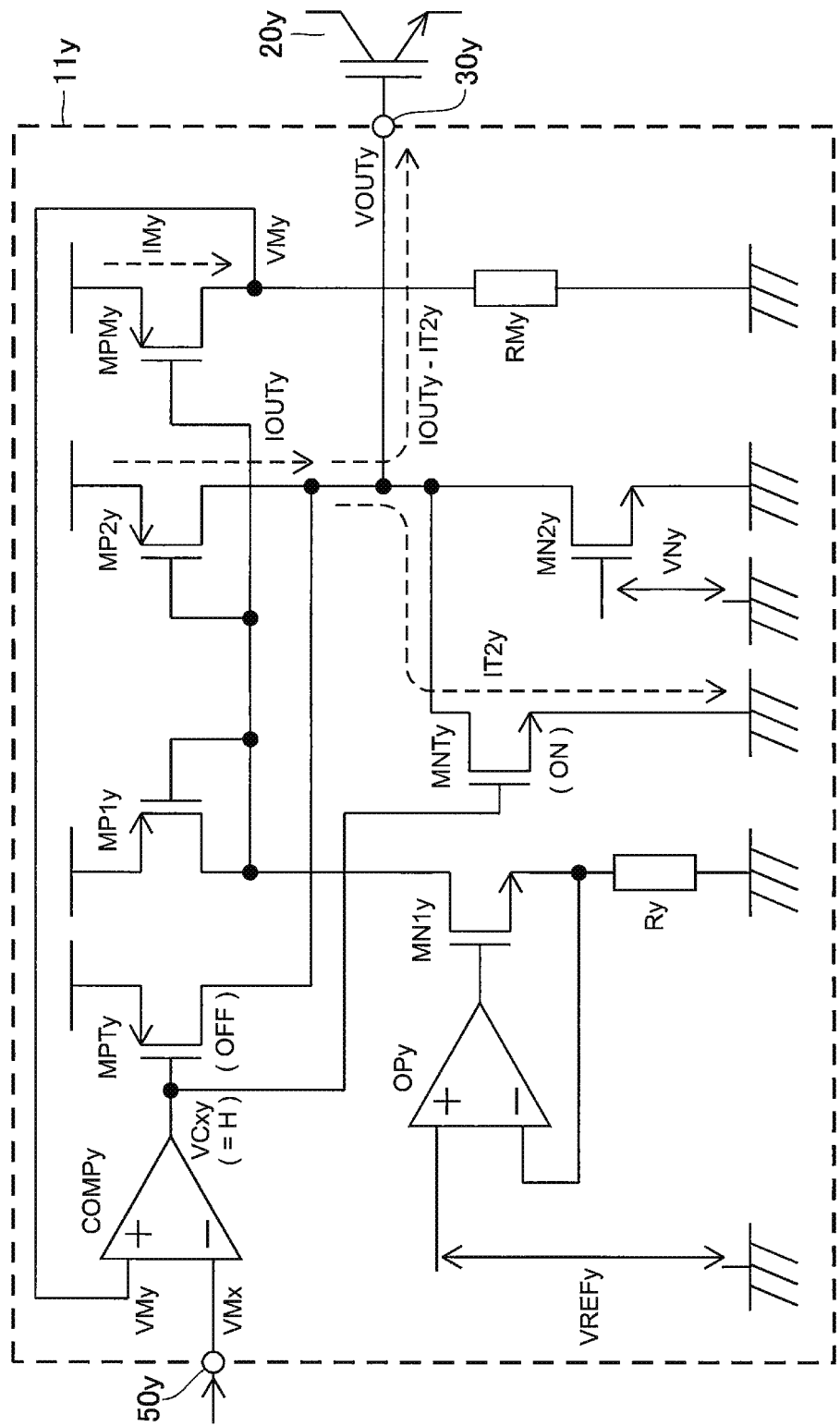
FIG. 6 is a circuit diagram illustrating a specific example of the Y-phase driver circuit in the three-phase single-chip gate driver IC used in the IPM according to Embodiment 2 and is also an explanatory drawing of subtractive output current control.
Figure 7:
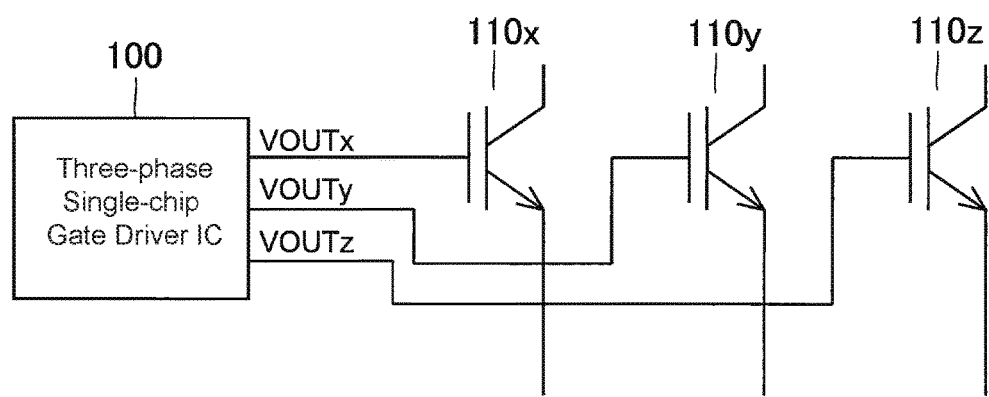
FIG. 7 illustrates a common IPM that includes three phases of semiconductor switches and a driver device therefor.

FIG. 5 is a circuit diagram illustrating a specific example of a Y-phase driver circuit in a three-phase single-chip gate driver IC used in an IPM according to Embodiment 2 and is also an explanatory drawing of additive output current control. FIG. 6 is a circuit diagram illustrating the same specific example of the Y-phase driver circuit in the three-phase single-chip gate driver IC used in the IPM according to Embodiment 2 and is also an explanatory drawing of subtractive output current control. In FIGS. 5 and 6, the same reference characters are used for components that are the same as or equivalent to components illustrated in FIG. 3, and detailed descriptions of such components will be omitted here. Moreover, although the description of Embodiment 2 focuses on the Y-phase driver circuit of the three-phase single-chip gate driver IC, a Z-phase driver circuit has the same configuration as the Y-phase driver circuit, and an X-phase driver circuit is the same as the X-phase driver circuit 10x illustrated in FIG. 2.

In the Y-phase driver circuit 11y illustrated in FIGS. 5 and 6, the circuit configuration of a constant current source formed by an op-amp OPy to which a signal VREFy is input, an NMOS transistor MN1y, and a resistor Ry is the same as the circuit configuration of the Y-phase driver circuit 10y illustrated in FIG. 3. Similarly, the configuration of a current mirror circuit formed by PMOS transistors MP1y and MP2y as well as the circuit configuration of a PMOS transistor MPMy and a resistor RMy that indirectly monitor the source current are the same as the circuit configuration of the Y-phase driver circuit 10y illustrated in FIG. 3. Moreover, a circuit configuration in which an NMOS transistor MN2y receives a signal VNy and draws a sink current is also the same as the circuit configuration of the Y-phase driver circuit 10y illustrated in FIG. 3. Furthermore, the circuit configuration of a current regulating PMOS transistor MPTy and a comparator COMPy that compares a reference voltage VMx to a voltage VMy corresponding to a monitored current IMy is the same as the circuit configuration of the Y-phase driver circuit 10y illustrated in FIG. 3. Therefore, detailed descriptions of the configurations of the portions of the circuit configuration that are the same as in the circuit configuration of the Y-phase driver circuit 10y illustrated in FIG. 3 will be omitted here.

The Y-phase driver circuit 11y further includes a current regulating NMOS transistor MNTy. The gate of the current regulating NMOS transistor MNTy is connected to the output of the comparator COMPy, and the source of the current regulating NMOS transistor MNTy is connected to ground. The drain of the current regulating NMOS transistor MNTy is connected to the node between the drain of the PMOS transistor MP2y and the drain of the NMOS transistor MN2y.

In the configuration described above, when the signal VREFy for switching ON an IGBT 20y is input, the op-amp OPy, the NMOS transistor MN1y, and the resistor Ry form the constant current source. The current from this constant current source is copied at a prescribed ratio by the current mirror circuit formed by the PMOS transistors MP1y and MP2y and then output as a current IOUTy. The current from the constant current source is also copied at a prescribed ratio by the current mirror circuit formed by the PMOS transistors MP1y and MPMy and then output as a current IMy, which is converted to the voltage VMy by the resistor RMy.

This voltage VMy is input to the comparator COMPy and compared to the reference voltage VMx, which corresponds to the current IOUTx output by the X-phase driver circuit 10x. Here, as illustrated in FIG. 5, when the output current decreases and the voltage VMy becomes less than the reference voltage VMx, the comparator COMPy outputs a signal VCxy at an L level, and therefore the current regulating PMOS transistor MPTy switches ON. As a result, the source current supplied to an output terminal 30y of the Y-phase driver circuit 11y is adjusted to a value greater than the current IOUTy by a current IT1y supplied by the PMOS transistor MPTy. In other words, the source current supplied to the gate of the IGBT 20y becomes equal to a value obtained by adding the current IT1y output from the current regulating PMOS transistor MPTy to the current IOUTy output from the PMOS transistor MP2y (that is, IOUTy+IT1y). The value of this added adjustment current IT1y is determined by appropriately selecting the size of the PMOS transistor MPTy. At this time, the current regulating NMOS transistor MNTy remains OFF due to receiving, at the gate thereof, the L level signal VCxy.

Meanwhile, as illustrated in FIG. 6, when the voltage VMy becomes greater than the reference voltage VMx, the comparator COMPy outputs the signal VCxy at an H level, and therefore the current regulating PMOS transistor MPTy switches OFF and the current regulating NMOS transistor MNTy switches ON. Therefore, the source current supplied to the output terminal 30y of the Y-phase driver circuit 11y is diverted by the current regulating NMOS transistor MNTy. As a result, the source current supplied to the output terminal 30y of the Y-phase driver circuit 11y is adjusted to a value less than the current IOUTy by a current IT2y diverted by the NMOS transistor MNTy. In other words, the source current supplied to the gate of the IGBT 20y becomes equal to a value obtained by subtracting the current IT2y drawn by the current regulating NMOS transistor MNTy from the current IOUTy output from the PMOS transistor MP2y (that is, IOUTy−IT2y). The value of this subtracted adjustment current IT2y is determined by appropriately selecting the size of the NMOS transistor MNTy. Note that although the current IT1y supplied by the current regulating PMOS transistor MPTy and the current IT2y drawn by the NMOS transistor MNTy are set to equal values in the present embodiment, these currents may be set to different values as necessary.

In the Y-phase driver circuit 11y, when the signal VNy for switching OFF the IGBT 20y is input, the NMOS transistor MN2y switches ON. As a result, the charge stored in the gate capacitance of the IGBT 20y is discharged, and the IGBT 20y switches OFF.

Although the embodiments above are configured such that the reference voltage VMx is obtained from the X-phase driver circuit 10x, the reference phase is not limited to being the X-phase and can be set to be the Y-phase or the Z-phase. Moreover, although the embodiments above were described as being three-phase driver devices, the present invention can also be applied to multiphase driver devices having any number of phases in a similar manner.

It will be apparent to those skilled in the art that various modifications and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

What is claimed is:

1. A multiphase driver device for a plurality of semiconductor switches, comprising:
   one phase driver circuit of a first type configured to be connected to one of the plurality of semiconductor switches, said one phase driver circuit of the first type supplying a first source current to one of the plurality of semiconductor switches and including a first monitoring transistor and a first monitoring resistor that converts a current flowing through the first monitoring transistor to a first voltage such that a value of the first voltage is proportional to the first source current, one phase driver circuit outputting the first voltage as a reference voltage; and
   a plurality of phase driver circuits of a second type configured to be connected to remaining semiconductor switches of the plurality of semiconductor switches, respectively, each of the plurality of phase driver circuits of the second type supplying a second source current to corresponding one of the remaining switches and including a second monitoring transistor and a second monitoring resistor that converts a current flowing through the second monitoring transistor to a second voltage such that a value of the second voltage is proportional to the second source current, each of the plurality of phase driver circuits of the second type further including a comparator that compares the second voltage to the reference voltage and a first regulating transistor that adds a first regulating current to the second source current in accordance with an output of the comparator.

2. The multiphase driver device according to claim 1, wherein each of the phase driver circuits of the second type further includes a second regulating transistor that subtracts a second regulating current from the second source current in accordance with the output of the comparator.

3. A power module, comprising:
the multiphase driver device as set forth in claim 1; and
the plurality of semiconductor switches connected to and driven by the multiphase driver device.

4. A three-phase driver device for driving a first semiconductor switch, a second semiconductor switch, and a third semiconductor switch, comprising:
a first phase driver circuit that drives the first semiconductor switch;
a second phase driver circuit that drives the second semiconductor switch; and
a third phase driver circuit that drives the third semiconductor switch,
wherein the first phase driver circuit supplies a first source current to a gate of the first semiconductor switch, and includes a first monitoring transistor and a first monitoring resistor that converts a current flowing through the first monitoring transistor to a first voltage such that a value of the first voltage is proportional to the first source current, the first phase driver circuit outputting the first voltage as a reference voltage,
wherein the second phase driver circuit supplies a second source current to a gate of the second semiconductor switch, and includes a second monitoring transistor and a second monitoring resistor that converts a current flowing through the second monitoring transistor to a second voltage such that a value of the second voltage is proportional to the second source current, the second phase driver circuit further including, a first comparator that compares the second voltage to the reference voltage and a first regulating transistor that adds a first regulating current to the second source current in accordance with an output of the first comparator, and
wherein the third phase driver circuit supplies a third source current to a gate of the third semiconductor switch, and includes a third monitoring transistor and a third monitoring resistor that converts a current flowing through the third monitoring transistor to a third voltage such that a value of the third voltage is proportional to the third source current, the third phase driver circuit further including a second comparator that compares the third voltage to the reference voltage and a second regulating transistor that adds a second regulating current to the third source current in accordance with an output of the second comparator.

5. The three-phase driver device according to claim 4, wherein the second phase driver circuit further includes a third regulating transistor that subtracts a third regulating current from the second source current in accordance with the output of the first comparator, and the third phase driver circuit further includes a fourth regulating transistor that subtracts a fourth regulating current from the third source current in accordance with the output of the second comparator.

6. The three-phase driver device according to claim 4,
wherein the first phase driver circuit further includes a first constant current source that outputs a prescribed first constant current upon input of a first ON control signal that switches ON the first semiconductor switch, and a first current mirror circuit that outputs the first source current by copying the first constant current,
wherein the second phase driver circuit further includes a second constant current source that outputs a prescribed second constant current upon input of a second ON control signal that switches ON the second semiconductor switch, and a second current mirror circuit that outputs the second source current by copying the second constant current, and
wherein the third phase driver circuit further includes a third constant current source that outputs a prescribed third constant current upon input of a third ON control signal that switches ON the third semiconductor switch, and a third current mirror circuit that outputs the third source current by copying the third constant current.

7. The three-phase driver device according to claim 6,
wherein the first constant current source of the first phase driver circuit includes a first operational amplifier that receives, at a non-inverting input, the first ON control signal; a first NMOS transistor in which a gate is connected to an output of the first operational amplifier, and a source is connected to an inverting input of the first operational amplifier; and a first resistor in which one end is connected to the source of the first NMOS transistor, and another end is connected to ground,
wherein the second constant current source of the second phase driver circuit includes a second operational amplifier that receives, at a non-inverting input, the second ON control signal; a second NMOS transistor in which a gate is connected to an output of the second operational amplifier, and a source is connected to an inverting input of the second operational amplifier; and a second resistor in which one end is connected to the source of the second NMOS transistor, and another end is connected to ground, and
wherein the third constant current source of the third phase driver circuit includes a third operational amplifier that receives, at a non-inverting input, the third ON control signal; a third NMOS transistor in which a gate is connected to an output of the third operational amplifier, and a source is connected to an inverting input of the third operational amplifier; and a third resistor in which one end is connected to the source of the third NMOS transistor, and another end is connected to ground.

8. The three-phase driver device according to claim 7,
wherein the first current mirror circuit of the first phase driver circuit includes a first PMOS transistor in which a gate and a drain are connected to a drain of the first NMOS transistor, and a source is connected to a power supply; and a second PMOS transistor in which a gate is connected to the gate and the drain of the first PMOS transistor, a source is connected to the power supply, and a drain is connected to the gate of the first semiconductor switch,
wherein the second current mirror circuit of the second phase driver circuit includes a third PMOS transistor in which a gate and a drain are connected to a drain of the second NMOS transistor, and a source is connected to a power supply; and a fourth PMOS transistor in which a gate is connected to the gate and the drain of the third PMOS transistor, a source is connected to the power supply, and a drain is connected to the gate of the second semiconductor switch, and
wherein the third current mirror circuit of the third phase driver circuit includes a fifth PMOS transistor in which a gate and a drain are connected to a drain of the third NMOS transistor, and a source is connected to a power supply; and a sixth PMOS transistor in which a gate is connected to the gate and the drain of the fifth PMOS transistor, a source is connected to the power supply, and a drain is connected to the gate of the third semiconductor switch.

9. The three-phase driver device according to claim 4,
wherein the first phase driver circuit further includes a first sink current transistor that draws a sink current from the gate of the first semiconductor switch upon input of a first OFF control signal that switches OFF the first semiconductor switch,
wherein the second phase driver circuit further includes a second sink current transistor that draws a sink current from the gate of the second semiconductor switch upon input of a second OFF control signal that switches OFF the second semiconductor switch, and
wherein the third phase driver circuit further includes a third sink current transistor that draws a sink current from the gate of the third semiconductor switch upon input of a third OFF control signal that switches OFF the third semiconductor switch.

10. A power module, comprising:
the three-phase driver device as set forth in claim 4; and
the first semiconductor switch, the second semiconductor switch, and the third semiconductor switch, connected to and driven by the three-phase driver device.

\* \* \* \* \*